US012658969B2

(12) United States Patent
Rimmelspacher et al.

(10) Patent No.: US 12,658,969 B2
(45) Date of Patent: Jun. 16, 2026

(54) DEVICES AND METHODS CONTROLLING A RADIO FREQUENCY PATH

(71) Applicant: Infineon Technologies AG, Neubiberg (DE)

(72) Inventors: Johannes Klaus Rimmelspacher, Munich (DE); Valentyn Solomko, Munich (DE); Andreas Bänisch, Grünwald (DE); Rüdiger Bauder, Bruckmühl (DE); Ralf Schnieder, Unterföhring (DE); Martin Pauer, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 252 days.

(21) Appl. No.: 18/503,765

(22) Filed: Nov. 7, 2023

(65) Prior Publication Data

US 2024/0171210 A1 May 23, 2024

(30) Foreign Application Priority Data

Nov. 22, 2022 (EP) ..................................... 22208809

(51) Int. Cl.
| | |
|---|---|
| *H04B 1/401* | (2015.01) |
| *H03K 5/135* | (2006.01) |
| *H04B 7/005* | (2006.01) |
| *H04J 3/06* | (2006.01) |

(52) U.S. Cl.
CPC ............. *H04B 1/401* (2013.01); *H03K 5/135* (2013.01); *H04B 7/005* (2013.01); *H04J 3/0635* (2013.01)

(58) Field of Classification Search
CPC ........ H04B 1/401; H04B 7/005; H03K 5/135; H04J 3/0635
See application file for complete search history.

(56) References Cited

U.S. PATENT DOCUMENTS

| | | | |
|---|---|---|---|
| 2010/0159864 A1* | 6/2010 | Rofougaran | ........ H04L 25/0278 455/248.1 |
| 2013/0021075 A1* | 1/2013 | Felix | ...................... H04B 15/06 327/164 |
| 2016/0126618 A1* | 5/2016 | Strange | .................. H01Q 1/241 343/861 |

FOREIGN PATENT DOCUMENTS

| | | |
|---|---|---|
| EP | 3016200 A1 | 5/2016 |
| GB | 2493026 A | 1/2013 |
| WO | 2018132216 A1 | 7/2018 |

* cited by examiner

*Primary Examiner* — John J Lee
(74) *Attorney, Agent, or Firm* — Slater Matsil, LLP

(57) ABSTRACT

According to an embodiment, a device includes an interface configured to receive a first clock signal. A delay circuit is configured to add variable delays to the first clock signal based on a delay control signal to generate a second clock signal with variable delays. A delay control signal is generated by a controller clocked by the second clock signal. The device further includes a radio frequency path, and the device is configured to control the radio frequency path based on the second clock signal.

20 Claims, 6 Drawing Sheets

DEVICES AND METHODS CONTROLLING A RADIO FREQUENCY PATH

This application claims the benefit of European Patent Application No. 22208809, filed on Nov. 22, 2022, which application is hereby incorporated herein by reference.

TECHNICAL FIELD

The present application relates to devices and methods involving a control of a radio frequency (RF) path.

BACKGROUND

In communication systems, radio frequency signals are propagated through radio frequency paths. Such communication devices also include digital blocks which are clocked by a clock signal. For example, such digital clocks may be used as controller to control elements of the radio frequency path like switches.

The operation of the digital block based on the clock signal acts as an interference aggressor on the radio frequency spectrum, i.e. the spectrum in the radio frequency path shows components at frequency of the clock signals and harmonics thereof. In particular, harmonics of the clock signal may be within a bandwidth used for radio frequency communication, thus reducing the quality of the actual radio frequency signal.

SUMMARY

According to an embodiment, a device is provided, comprising: an interface configured to receive a first clock signal, a delay circuit configured to add variable delays to the first clock signal based on a delay control signal to generate a second clock signal with variable delays, a controller clocked by the second clock signal and configured to generate the delay control signal; and a radio frequency path, wherein the device is configured to control the radio frequency path based on the second clock signal.

In another embodiment, an apparatus is provided, comprising: an antenna, one or more tuning impedances, and the device as mentioned above, wherein the radio frequency path of the device is coupled to the one or more tuning impedances such that controlling the radio impedances such that controlling the radio frequency path controls tuning of the antenna by the one or more tuning impedances.

In another embodiment, a method is provided, comprising: receiving, at an interface, a first clock signal, adding variable delays to the first clock signal based on a delay control signal to generate a second clock signal with variable delays, generating the delay control signal with a controller clocked by the second clock signal; and controlling a radio frequency path based on the second clock signal.

The above gives merely a brief overview and is not to be construed as limiting, as other embodiments may include different features than the ones given above.

DETAILED DESCRIPTION OF THE DRAWINGS

DETAILED DESCRIPTION

Figure 1:
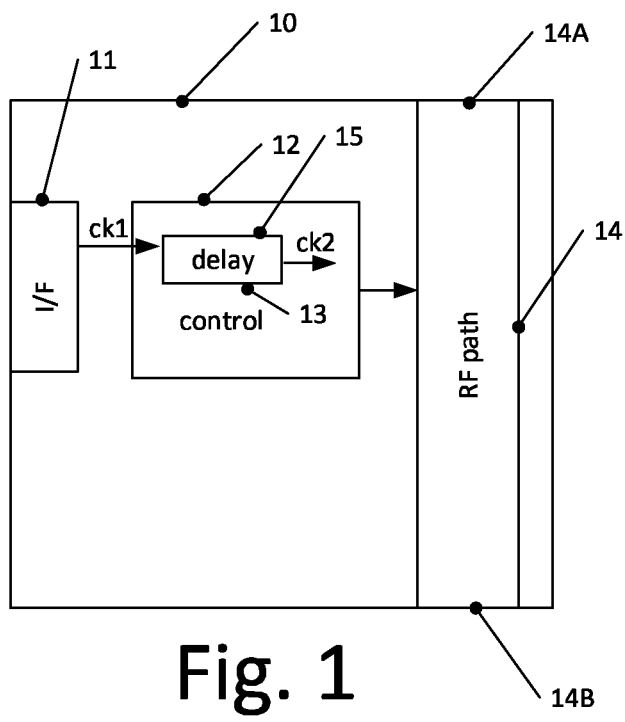
FIG. 1 is a block diagram of a device according to an embodiment.

In the following, various embodiments will be described in detail referring to the attached drawings. These embodiments are given as examples only and are not to be construed as limiting. For example, while embodiments may be described as comprising a plurality of features (for example components, elements, acts, events, steps etc.), in other embodiments some of these features may be omitted or replaced by alternative features. In addition to the features explicitly shown and described, additional features may be provided, for example features used in conventional radio frequency devices. Such conventional features will not be described in detail.

Variations, modifications and details described with respect to one of the embodiments may also be applied to other embodiments and therefore will not be described repeatedly. Features from different embodiments may be combined to form further embodiments.

Any connections or couplings between elements shown in the drawings or described herein are electrical connections or couplings unless noted otherwise. Such connections or couplings may be modified, for example by adding or removing elements, as long as the general purpose of the connection or coupling, for example to transmit a certain signal, to provide a current and/or voltage, to provide a control etc. is essentially maintained.

Turning now to the drawings, FIG. 1 is a block diagram of a device 10 according to an embodiment.

Device 10 of FIG. 1 includes an interface 11, which is configured to receive a clock signal ck1 from an external entity. For example, clock signal ck1 may be a clock signal used in an apparatus in which device 10 is provided. Interface 11, in addition to receiving clock interface ck1, may also be used to receive and/or send a data signal clocked by clock signal ck1, as will be explained further below with reference to FIG. 10. In some embodiments, interface 11 may be a synchronous clocked digital serial interface like a MIPI RFFE interface, but is not limited thereto.

Clock signal ck1 is provided to a controller 13, which may include digital circuitry, analog circuitry or both. In particular, clock signal ck1 is provided to a delay circuit 15 of controller 13. Delay circuit 15 is configured to add variable delays to clock signal ck1, in particular variable random delays, to generate a clock signal ck2 with variable delays. Delay circuit 15 is controlled by controller 13. For example, controller 13 may provide a delay control signal based on a random sequence to delay circuit 15. In turn, in embodiments discussed herein, controller 13, for example to generate the delay control signal, is clocked by second clock signal ck2. The term "random sequence" as used herein also includes pseudorandom sequences, i.e. sequences that appear random, but are generated for example by a circuit which operates in a deterministic manner. The same applies to other uses of the term "random"; also here "pseudorandom" is intended to be included, e.g. in random delays. In other embodiments, a predefined sequence not generated by a pseudorandom sequences generator or the like may be used.

The concept of variable, in particular random, delays will be described in further detail further below with reference to FIGS. 5A to 5C and 6. In such a clock signal with variable delays, for example each clock pulse, each rising edge, each falling edge or both rising and falling edge may be delayed by a random delay.

In some embodiments, second clock signals ck2 is used internally within device 10, whereas for external communication, for example via interface 11, first clock signals ck1 is used. Therefore, second clock signal ck2 in some embodiments is "hidden" to the world outside device 10, such that other devices may communicate and treat device 10 as a device operating on a normal clock signal, i.e. first clock signal ck1, without such variable delays. However, for example controller 13 may operate based on second clock signal ck2, and device 10 may in particular control a radio frequency path (RF path) between a first node 14A and a second node 14B based on second clock signal ck2. Controlling RF path 14 may for example include controlling switches of RF path 14, for example for tuning purposes, or controlling other elements in RF path 14 like adjustable, e.g. tuneable or switchable amplifiers, capacitors and inductors, oscillators, mixers, phase locked loops (PLLs), resonators, filters or other elements that have settings, as will be explained below using examples.

In some embodiments, by using second clock signal ck2 with variable delays, an impact of interference from controller 13 to radio frequency parts of an apparatus or system, including radio frequency path 14 and signals transmitted therein, may be reduced. For example, contributions of harmonics of second clock signal ck2 in radio frequency path 14 or other radio frequency circuits outside device 10 may be "smeared out", i.e. distributed with a lesser amplitude over a wider frequency range, such that for individual frequencies device 10 has less impact on radio frequency signals. This also will be explained further below in more detail.

Figure 2:
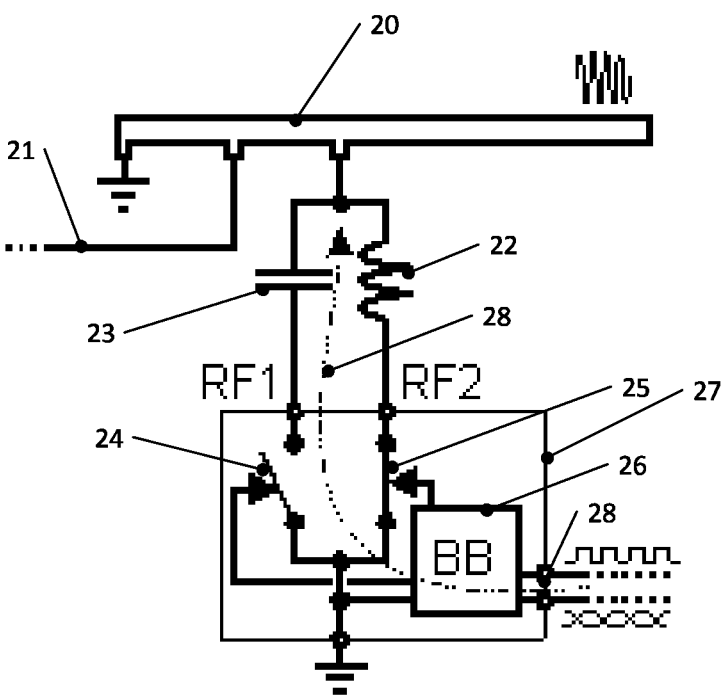
FIG. 2 is a diagram illustrating an apparatus according to an embodiment.

FIG. 2 is a diagram including an apparatus according to an embodiment, that comprises a device 27 according to an embodiment. The apparatus of FIG. 2 may for example be part of a mobile communication device and includes an antenna 20 to which for example signals to be transmitted may be provided via a line 21, and/or received signals may be tapped via line 21, as in conventional communication devices.

For tuning purposes, a node of antenna 20 is coupled to an inductor 22 and a capacitor 23 as shown. Via a switch 24 of device 27, capacitor 23 may selectively be coupled to ground, and via a switch 25 of device 27, inductor 22 may be selectively coupled to ground. Switches 24, 25 are an example for RF path 14 of FIG. 1, included in device 27.

Furthermore, device 27 includes a building block 26 which may include analog and digital circuitry and which receives at least a clock signal and a data signal via an interface 28. The data signal is clocked by the clock signal and for example indicates which of switches 24, 25 is to be closed and opened. Building block 26 includes a variable delay circuit and a controller as discussed with reference to FIG. 1 for delay circuit 13, to provide the clock signal received at interface 28 with variable delays. Internally, building block 26 then operates on the clock signal with variable delays, corresponding to second clock signal ck2 of FIG. 1, and e.g. operates switches 24, 25 based on this clock signal with variable delays. This mitigates radio interference as indicated by an arrow 28 in FIG. 2 as frequency contributions for example of harmonics of the clock signal may be spread out over a wider frequency range with lower intensity.

Building block 26 may also transmit signals via interface 28, based on the clock signal received, and not based on the clock signal with variable delays, such that in communications via interface 28 the clock signal with variable delays is not used.

The configuration with two single pole single throw switches in FIG. 2 (switches 24, 25) is merely an example for an RF path, and other elements then switches or other switch configurations, for example configurations conventionally used in antenna or RF tuning applications, may also be used.

Figure 3:
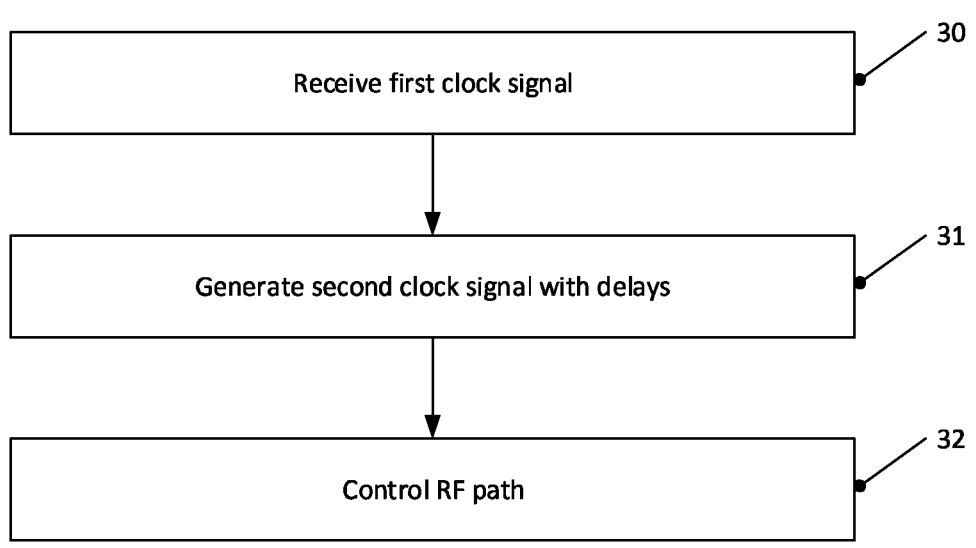
FIG. 3 is a flowchart illustrating a method according to an embodiment.

FIG. 3 is a flow chart illustrating a method according to an embodiment.

The method of FIG. 3 may be implemented in the devices discussed above or below, but is not limited thereto.

At 30, the method includes receiving a first clock signal at an interface of a device, for example together with a data signal, as explained below.

At 31, the method comprises generating a second clock signal with variable, in particular random, delays, based on the first clock signal, as also explained above. The control of the variable delays, for example generation of a random sequence, is performed by a controller clocked by the second clock signal (immediately at start-up, before the first variable delay is added, the second clock signal may correspond to the first clock signal) This second clock signal may then be used internally in the device, for example at 32 to control an RF path based on the second clock signal.

Next, the concept of mitigating radio frequency disturbances using variable delays will be explained in some more detail.

Figures 4A, 4B:
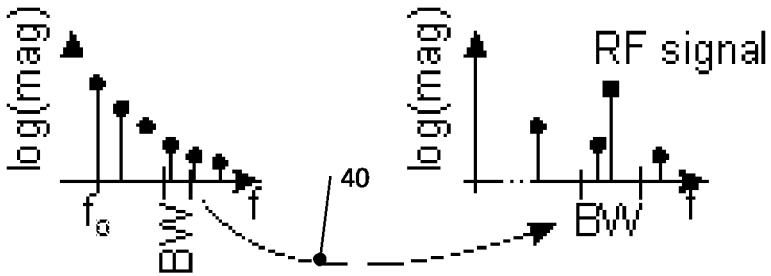
FIGS. 4A and 4B are explanatory diagrams for explaining interference from a digital block to a radio frequency path.

FIG. 4A schematically shows a frequency of a digital signal like a clock signal at a frequency $f_0$ and its harmonics, where the logarithmic magnitude of the signal is plotted over frequency. Generally, the magnitude $|U(v)|$ of harmonic v for an ideal square-wave clock signal waveform having instantaneous edges (no transition time between high and low signal levels) may be calculated for a square-wave signal with instantaneous transitions (edges) through a Fourier series as $$|U(v)| = 2V_0 D \frac{|\sin(vD\pi)|}{vD\pi} \tag{1}$$

wherein D is the duty cycle of the signal, for example clock signal, and $V_0$ the voltage swing (the digital signals, including the clock signal, have a high signal level and a low signal level, and the voltage swing is the difference between the high and low signal levels). BW in FIGS. 4A and 4B indicates a bandwidth of an RF path like RF path 14 of FIG. 1 or a bandwidth in which antenna 20 of FIG. 2 receives and/or transmits signals.

FIG. 4B shows the RF signal in the bandwidth BW together interference from the digital signal. As can be seen, some of the harmonics are within the bandwidth of the RF signal, thus constituting an interference, which may degrade the signal quality.

This interference may to some extent be minimized through circuit and layout techniques that minimize the coupling effects to radio frequency path. This may include electrical and spatial separation of circuit blocks with digital signal paths from radio frequency ports on a chip level, package level or printed circuit board level. However, with increasing integration, it is for example desirable to have the switches of FIG. 2 or any other RF path on a same chip and therefore in close proximity to a control block like building block 26, thus limiting the applicability of such techniques. By introducing variable delays, the amplitude of the distortion at a given frequency may be reduced.

Figure 5A:
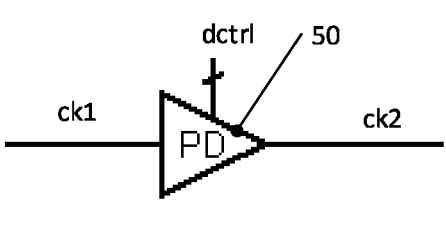
FIG. 5A is a diagram illustrating introduction of variable delays to a clock circuit.
Figure 5B:
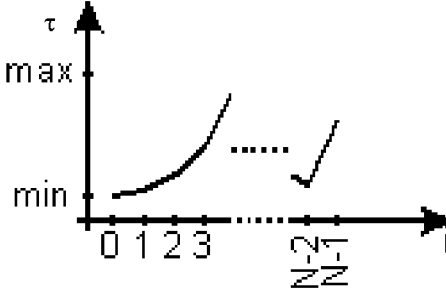
FIGS. 5B and 5C are diagrams illustrating the operation of FIG. 5A.
Figures 5C, 6:
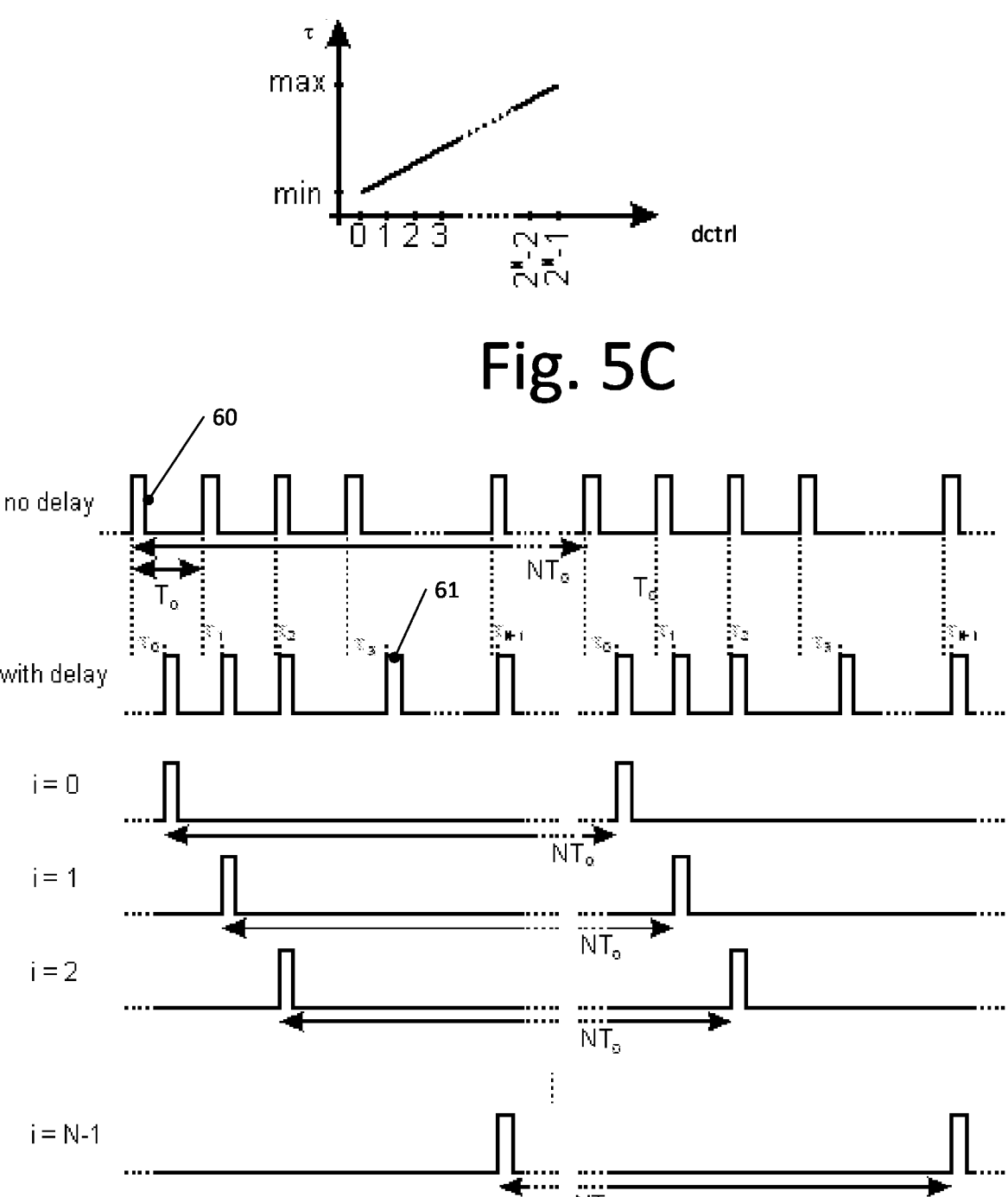
FIG. 6 is a signal diagram for explaining various embodiments.

FIGS. 5A to 5C illustrate the generation of second clock signal. In FIG. 5A, first clock signal ck1 is provided to a programmable delay 50. Programmable delay 50 is controlled by digital control signal dctrl. In some embodiments, control signal dctrl may be at least a 2-bit signal (corresponding to four possible different delays), for example a control signal with a bitwidth between 3 and 7, for example a bitwidth of 5. Generally, a higher bitwidth corresponding to more possible delays may lead to an improved effect regarding the distribution of interference over a broader frequency range, but on the other hand may increase an area needed for implementation. A bitwidth around 5 in some applications may be a good compromise between the effect achieved and the area required for implementation. However, even a 1-bit signal dctrl corresponding to two possible delays (including the possibility of either a predefined delay or no delay) in some embodiments already reduces the distortion at frequencies of harmonics of the clock signal and may offer a simple implementation.

Programmable delay 50 then outputs second clock signal ck2. Control signal dctrl may be changed from clock cycle to clock cycle, for example clocked by ck2. In some embodiments, the delay may depend linearly on the control signal dctrl, as shown in FIG. 5C, where the delay $\tau$ is plotted over the control signal value for an N-bit signal control signal dctrl, i.e. values from 0 to $2^{N-1}$ of dctrl. The applied value may be generated randomly as disclosed further below, by applying a pseudo random sequence of values of length L, which may be repeated periodically. It should be noted that the linear profile of FIG. 5C is only an example, and other profile forms may also be used, for example an exponential or half-sine form. In some embodiments, such non-linear form may reduce complexity of the programmable delay circuit, may reduce power consumption or may reduce harmonic distortion caused by the programmable delay itself.

One implementation example of programmable delay 50 includes a delay resistor-capacitor (RC) series circuit that is driven through an inverter. The inverter charges and discharges the capacitor via the series resistor during each transition on the digital signal (e.g., first clock signal ck1) applied to its input. The time durations needed for charging and discharging the capacitor from low-to-high and high-to-low voltage level have ideally linear dependency on the product of values of R and C, and provide the intended delay. The transient voltage level across the capacitor triggers the output inverter that provides the delayed clock edge of the input inverter's input signal. The capacitor in the RC circuit consists of capacitor banks in parallel configuration, that can be connected or disconnected from the delay RC circuit. Each of these connections can be controlled independently through one control input bit of delay control signal dctrl, respectively. Therefore, the total capacitance in the RC circuit depends on the delay bit setting, hence the delay of the RC circuit depends on these bits as well. In case of the linear delay profile discussed with respect to FIG. 5C above, the size of the capacitor banks is increasing to the power of two: the least significant bit of dctrl switches the smallest capacitor bank with capacitance Cmin, the second bit the capacitor bank with twice Cmin, the third bit the capacitor bank with quadruple Cmin, the fourth bit 8 Cmin and so on.

FIG. 5B shows an example behaviour of the delay $\tau$ over the number of cycle i, but this sequence is only an example, and other values may be used as well.

FIG. 6 is an example showing signals provided with such a pseudo random sequence causing delays $\tau_0$ to $\tau_{N-1}$, and then again $\tau_0$, i.e. according to a pseudorandom sequence having a length N−1 which is then repeated. A curve 60 illustrates an example clock signal without delays, with a fixed period $T_0$. A curve 61 shows the clock signal with the delays according to the pseudo random sequence applied. As can be seen, the period length between two clock pulses varies in this case. However, as shown in the curves labelled i=0 to i=N−1, the period length between two pulses modulated with the same delay ($\tau_0$ for i=0, $\tau_1$ for i=1 ... $\tau_{N-1}$ for i=N−1) still is $N \times T_0$.

In contrast to the magnitude according to equation (1) above for a signal without the delays applied, the magnitude $|U(v)|$ of harmonic v after the application of the delay is calculated according to:

$$|U(v)| = \sqrt{(a_v^2 + b_v^2)c_v^2}$$

by applying a Fourier Series to the square-wave signal $$u(t) = a_0 + \frac{1}{N}\sum_{v=1}^{\infty}\left(\sum_{i=0}^{N-1}\left(a_v\cos\left(\frac{v\omega_0(t - iT_0 - \tau_i)}{N}\right) + b_v\sin\left(\frac{v\omega_0(t - iT_0 - \tau_i)}{N}\right)\right)\right)$$

where the parameter $c_v$ is the attenuation of the harmonic without delay modulation $$c_v^2 = \frac{1}{N^2}\left(\left(\sum_{i=0}^{N-1}\cos\left(\frac{v\omega_0(iT_0 + \tau_i)}{N}\right)\right)^2 + \left(\sum_{i=0}^{N-1}\sin\left(\frac{v\omega_0(iT_0 + \tau_i)}{N}\right)\right)^2\right)$$

Figure 11:
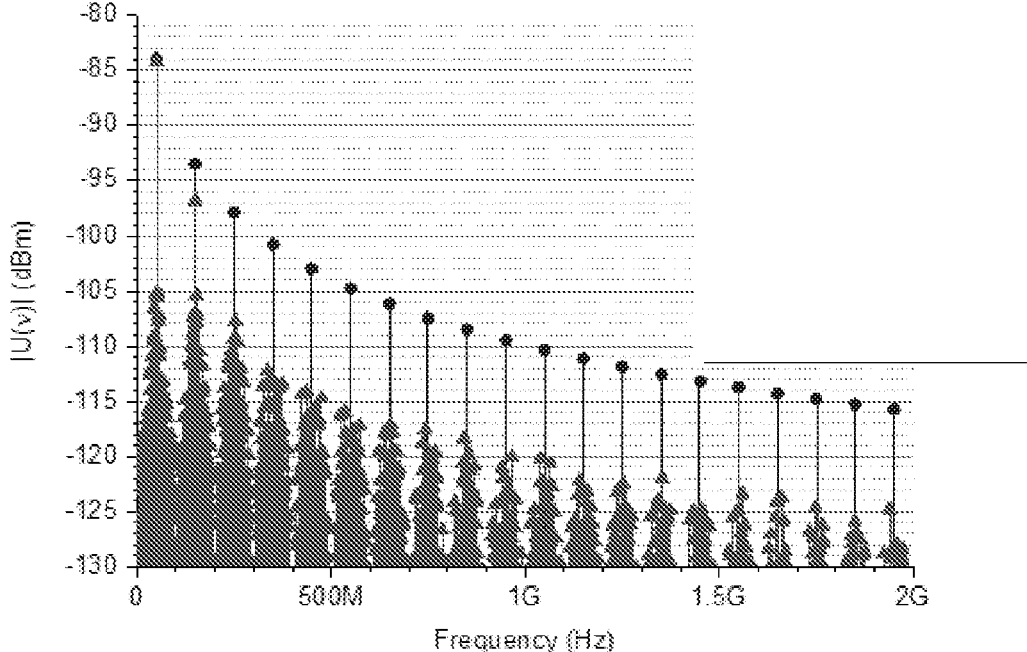
FIG. 11 is an example graph illustrating the effects of some embodiments.

The parameters $a_0$, $a_v$ and $b_v$ are the Fourier coefficients of the square-wave first clock signal (see curve 60 of FIG. 6) without the variable delays, for example signal ck1. The harmonics Nv correspond to the harmonic distortion of the unmodulated signal. FIG. 11 shows results for an example implementation, where circles show values of $|U(v)|$ in dBm without applying delays, whereas triangles show values with an applied delay signal, for a delay sequence length N=31, a duty cycle of the clock signal of 0.5, a frequency of 50 MHz and a signal swing $V_0$ of 0.1 mV with 50 Ohm termination. As can be seen, by applying the variable delays, the peak values of $|U(v)|$ are reduced significantly, for example in the order of 10 dB, even if additional contributions occur in sidebands due to the "smearing out" of the disturbance.

Figure 7:
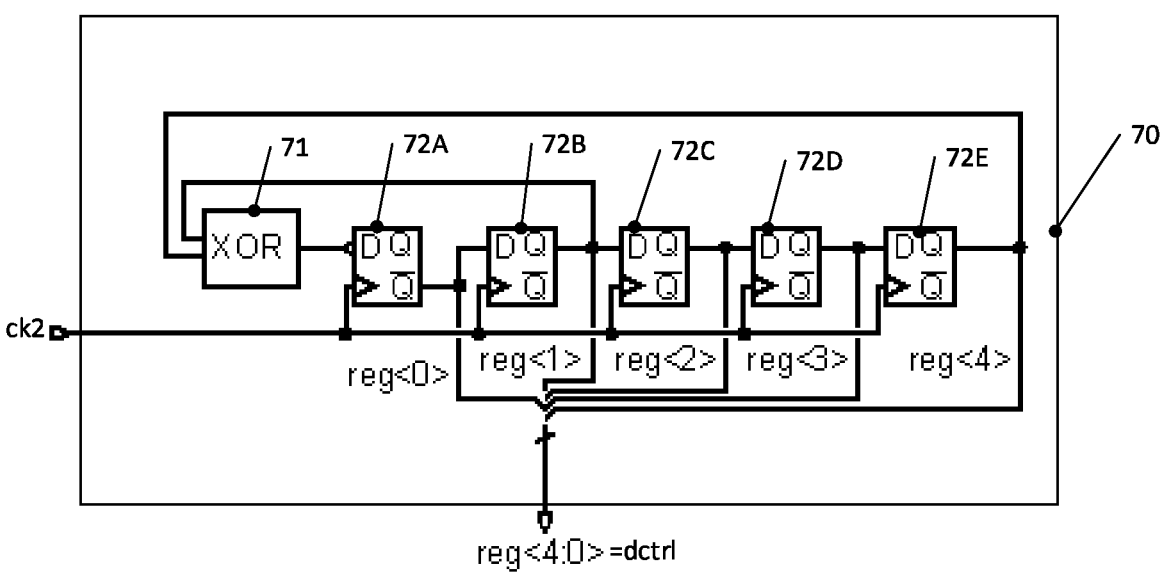
FIG. 7 is a circuit diagram of a circuit generating random numbers usable as delay control signal in some embodiments.

FIG. 7 is a circuit diagram showing an example for a pseudo random bit sequence generator circuit 70 which generates pseudo random sequences of 5-bit values reg <4:0>, which sequences are then repeated, which is usable to generate the control signal for a delay element, for example signal dctrl of FIG. 5A. Circuit 70 may be integrated in building block 26 of FIG. 2 or controller 13 of FIG. 1, in particular a digital part thereof.

Circuit 70 comprises a shift register structure including five registers 72A to 72E which are arranged in a chain, where an inverted output Q̄ of register 72A is provided to a data input D of second register 72B, and respective non-inverted outputs Q of register 72B, 72C and 72D are provided to a respective data input D of a respective following register 72C, 72D, 72E, respectively. Furthermore, the non-inverting outputs Q of registers 72B, 72E are provided to inputs of an exclusive or gate 71, and the output of exclusive or gate 71 is provided to a data input D of register 72A.

The inverted output Q̄ of register 72A and then non-inverted outputs Q of registers 72B to 72E form the 5 bits reg<0> to reg<4> of a 5-bit value reg<4:0>, which may for example be used as signal dctrl. Registers 72A to 72E are clocked by a clock signal ck2, i.e. the clock signal with variable delays. In this way, in some embodiments, the operation of circuit 70 itself causes only a reduced peak interference to the RF path compared to a clocking with ck1.

Figure 8:
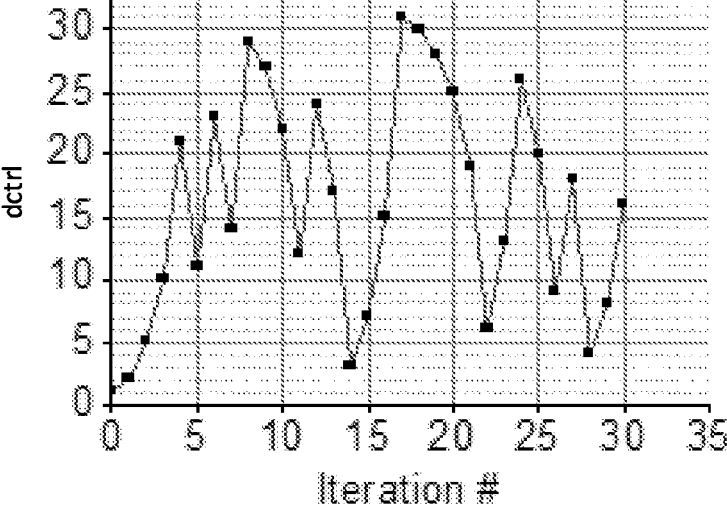
FIG. 8 is a diagram illustrating operation of the circuit of FIG. 7.

FIG. 8 shows an example sequence for control signal dctrl resulting from circuit 70 of FIG. 7 over 30 iterations, i.e. 30 clock signal cycles of signal ck2 in FIG. 7. When this sequence is then fed to a programmable delay like programmable delay 50 of FIG. 5A, a corresponding sequence of delays results.

Circuit 70 is merely an example for a pseudo random sequence generator circuit, and variations or pseudo random sequence generator circuits known to the skilled person may also be used. For instance, in circuit 70, an additional logic may be provided which detects when circuit 70 is in a state of zero (e.g., dctrl has only bits 0) and in response thereto feeds a logic 1 to the data input of first register 72A.

Figure 9:
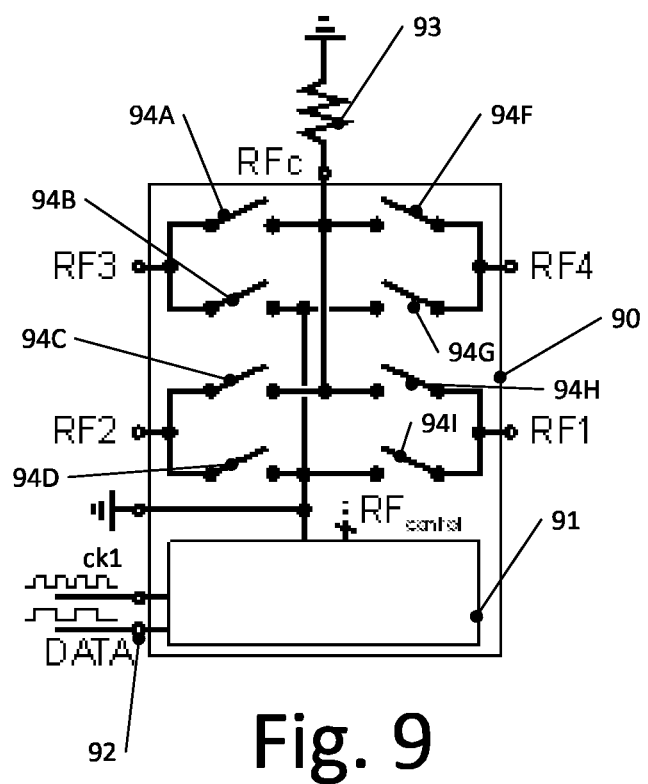
FIG. 9 is a circuit diagram of a device according to some embodiments.

FIG. 9 illustrates a device according to a further embodiment, which was used for some measurements.

Device 90 of FIG. 9 includes eight switches 94A to 94I coupled in a single pole 4-throw (SP4T) configuration with resonance stopper as shown in FIG. 9. The switches are controlled by a building block 91 receiving a first clock signal ck1 and a data signal DATA via an interface 92. As explained previously, building block 91 internally provides the first clock signal ck1 with variable delays to generate a second clock signal, which is then used internally in building block 91 and ultimately therefore to generate the signal RF_control to control switches 94A to 94I, which are an example for an RF path. For measurement purposes, instead for example of an antenna for tuning purposes a resistor 93 was added as a measurement resistor for a spectrum analyzer.

Also, in this arrangement, measurements have shown a suppression of spurious tones having high magnitude, for example by 10 dBm, while sidebands occur due to the "smearing out".

Figure 10:
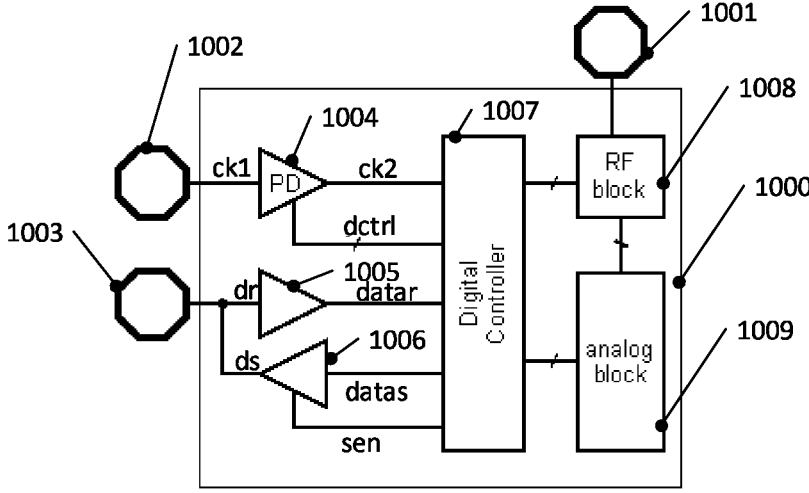
FIG. 10 is a block diagram of a device according to an embodiment.

FIG. 10 is a more detailed block diagram of a device 1000 according to an embodiment. Device 1000 includes a clock pad 1002 configured to receive a first clock signal ck1 and a pad 1003 configured for sending and receiving data. Received data dr is provided to a digital controller 1007 via a receive buffer 1005 as a buffered receive data signal datar, and data to be send datas is provided to pad 1003 as transmit data ds via a transmit buffer 1006, which is controlled by an enable signal sen. In some embodiments, the interface provided at pads 1002, 1003 may be a synchronous clocked serial digital interface like a MIPI RFFE interface.

First clock signal ck1 is provided to a programmable delay 1004, the function of which corresponds to programmable delay 50 of FIG. 5A. Programmable delay 1004 is controlled by digital controller 1007 via a digital control signal dctrl, which may be generated by digital controller 1007 as explained above, for example based on circuit 70 shown in FIG. 7.

In some embodiments, receive buffer 1005 may also include a programmable delay, which is configured to apply the same delay to received data dr as programmable delay 1004 applies to first clock signal ck1. In this case, buffered receive data signal datar includes the same variable delays as second clock signal ck1. This may facilitate processing of buffered receive data signal datar by digital controller 1007, as the timing of the two signals is the same. In other embodiments, no such delays may be applied to received data signal dr. In this case, for example the delays applied to ck1 may be small enough to still allow processing of datar based on ck2 by digital controller 1007, in particular smaller than a period of clock signal ck1.

Receive data datar may for example give instructions to device 1000 which switches in an RF block 1008 are to be opened and closed. Furthermore, digital controller 1007 may also control an analog circuit block 1009.

An analog circuit block 1009 can include a circuit that provides process/supply voltages/temperature independent voltage/current references and DC-to-DC-conversion circuits. Examples of such circuits include bandgap reference circuits and charge pumps, but are not limited thereto. The voltage/current references provide stable references for the DC-to-DC-conversion circuits that generate stable biasing voltage levels for e.g. RF switching devices in RF block 1008. The output voltage levels of the DC-to-DC-conversion circuits could be trimmed through the digital controller signals. The outputs of the DC-to-DC conversion circuits could provide the opening (ON) and/or closing (OFF) voltage levels on RFcontrol signal in FIG. 9. In this case, the high and/or low signal levels of RF_control signals are different from the external voltages that supply the chip. The translation between the digital controller signal that could be in another voltage domain as the switching devices in RF block but controls the switching devices, and the actual in analog block generated biasing voltages for proper biasing of these switching devices can be implemented through voltage level shifters, which would then be part of RF block 1008 in the example in FIG. 10.

In some embodiments, transmit signal ds may be clocked by first clock signal ck1 (for example by clocking transmit buffer 1006 based on ck1), such that to the outside the interface appears to be clocked by ck1, without the second clock signal ck2 being visible to a further device communicating with device 1000. In other embodiments, transmit signal ds may be clocked by second clock signal ck2, which in some implementations may reduce RF disturbance from transmit signal ds to RF circuits, as discussed above. In still other embodiments, it may be user configurable whether transmit signal ds is based on ck1 or ck2.

Some embodiments are defined by the following examples:

Example 1. A device, comprising: an interface configured to receive a first clock signal, a delay circuit configured to add variable delays to the first clock signal based on a delay control signal to generate a second clock signal with variable delays, a controller clocked by the second clock signal and configured to generate the delay control signal, and a radio frequency path, wherein the device is configured to control the radio frequency path based on the second clock signal.

Example 2. The device of example 1, wherein the delay circuit is configured to delay at least one edge of each of a plurality of clock pulses of the first clock signal according to the delay control signal, wherein the delay control signal indicates a random delay sequence.

Example 3. The device of example 2, wherein the random delay sequence has a length L and is repeated periodically.

Example 4. The device of example 2 or 3, wherein the delay circuit comprises a programmable delay element, and wherein the controller comprises a random sequence generator circuit configured to generate the delay control signal clocked by the second clock signal.

Example 5. The device of example 4, wherein the random sequence generator circuit is configured to generate digital random values with a bitwidth equal to or greater than 2.

Example 6. The device of example 5, wherein the bitwidth is between 3 and 7.

Example 7. The device of any one of examples 1 to 6, wherein each of the variable delays is smaller than a period length of the first clock signal.

Example 8. The device of any one of examples 1 to 7, wherein the radio frequency path includes one or more radio frequency switches, and wherein, to control the radio frequency path, the device is configured to control the one or more radio frequency switches.

Example 9. The device of any one of examples 1 to 8, wherein the interface is further configured to receive a data signal, wherein the device is configured to control the radio frequency path further based on the received data signal.

Example 10. The device of example 9, further comprising a further delay circuit configured to add variable delays to the received data signal corresponding to the variable delays added to the first clock signal, to generate a further received data signal with variable delays.

Example 11. The device of example 9 or 10, wherein the interface comprises a synchronous clocked serial digital interface.

Example 12. The device of example 11, wherein the interface is a MIPI RFFE interface.

Example 13. The device of any one of examples 1 to 12, wherein the device is further configured to send transmit data over the interface based on the first clock signal.

Example 14. The device of example 13, wherein the device is configured to configurably send the transmit data either based on the first clock signal or based on the second clock signal.

Example 15. An apparatus, comprising: an antenna, one or more tuning impedances, and the device of any one of examples 1 to 14, wherein the radio frequency path of the device is coupled to the one or more tuning impedances such that controlling the radio frequency path controls tuning of the antenna by the one or more tuning impedances.

Example 16. A method, comprising: receiving, at an interface, a first clock signal, adding variable delays to the first clock signal based on a delay control signal to generate a second clock signal with variable delays, generating the delay control signal with a controller clocked by the second clock signal; and controlling a radio frequency path based on the second clock signal.

Example 17. The method of example 16, wherein adding variable delays comprises delaying at least one edge of each of a plurality of clock pulses of the first clock signal according to the delay control signal, wherein the delay control signal indicates a random delay sequence.

Example 18. The method of example 17, further comprising generating the delay control signal using a random sequence generator circuit clocked by the second clock signal.

Example 19. The method of any one of examples 16 to 18, further comprising receiving a data signal, adding variable delays to the received data signal corresponding to the variable delays added to the first clock signal, to generate a further received data signal with variable delays, and controlling the radio frequency path based on the further received data signal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A device, comprising:
an interface configured to receive a first clock signal;
a delay circuit coupled to the interface and configured to add variable delays to the first clock signal based on a delay control signal to generate a second clock signal with the variable delays;
a controller coupled to the delay circuit, the controller configured to be clocked by the second clock signal, and configured to generate the delay control signal; and
a radio frequency path comprising one or more radio frequency switches configured to be coupled to an antenna tuning circuit, wherein the controller is configured to control the one or more radio frequency switches of the radio frequency path based on the second clock signal.

2. The device of claim 1, wherein the delay circuit is configured to delay at least one edge of each of a plurality of clock pulses of the first clock signal according to the delay control signal, and the delay control signal indicates a random delay sequence.

3. The device of claim 2, wherein the random delay sequence has a length L and is repeated periodically.

4. The device of claim 2, wherein the delay circuit comprises a programmable delay element, and the controller comprises a random sequence generator circuit configured to generate the delay control signal clocked by the second clock signal.

5. The device of claim 1, wherein each of the variable delays is smaller than a period length of the first clock signal.

6. The device of claim 1, wherein the interface is further configured to receive a data signal, and the device is configured to control the radio frequency path based on the received data signal.

7. The device of claim 6, further comprising a further delay circuit configured to:

add further variable delays to the received data signal corresponding to the variable delays added to the first clock signal; and generate a further received data signal with the further variable delays.

8. The device of claim 6, wherein the interface comprises a synchronous clocked serial digital interface.

9. The device of claim 8, wherein the interface is a MIPI RFFE interface.

10. The device of claim 1, wherein the device is further configured to send transmit data over the interface based on the first clock signal.

11. The device of claim 10, wherein the device is configured to configurably send the transmit data either based on the first clock signal or based on the second clock signal.

12. The device of claim 1, further comprising:

the antenna tuning circuit; and an antenna coupled to the antenna tuning circuit.

13. An apparatus, comprising:

an antenna, one or more tuning impedances coupled to the antenna, and a device coupled to the one or more tuning impedances, the device comprising:

an interface configured to receive a first clock signal, a delay circuit coupled to the interface and configured to add variable delays to the first clock signal based on a delay control signal to generate a second clock signal with the variable delays, a controller coupled to the delay circuit, the controller configured to be clocked by the second clock signal, and configured to generate the delay control signal, and a radio frequency path coupled to the one or more tuning impedances and configured to receive the second clock signal, wherein the device is configured to control the radio frequency path by controlling a tuning of the antenna via the one or more tuning impedances based on the second clock signal.

14. The apparatus of claim 13, wherein the delay circuit is configured to delay at least one edge of each of a plurality of clock pulses of the first clock signal according to the delay control signal, and the delay control signal indicates a random delay sequence.

15. The apparatus of claim 14, wherein the random delay sequence has a length L and is repeated periodically.

16. The apparatus of claim 14, wherein the delay circuit comprises a programmable delay element, and the controller comprises a random sequence generator circuit configured to generate the delay control signal clocked by the second clock signal.

17. A method, comprising:

receiving, at an interface, a first clock signal, adding variable delays to the first clock signal based on a delay control signal to generate a second clock signal with the variable delays, generating the delay control signal with a controller clocked by the second clock signal; and controlling one or more switches of a radio frequency path based on the second clock signal, wherein the one or more switches of the radio frequency path are coupled to an antenna via an antenna tuning circuit.

18. The method of claim 17, wherein adding the variable delays comprises delaying at least one edge of each of a plurality of clock pulses of the first clock signal according to the delay control signal, wherein the delay control signal indicates a random delay sequence.

19. The method of claim 18, further comprising generating the delay control signal using a random sequence generator circuit clocked by the second clock signal.

20. The method of claim 17, further comprising:

receiving a data signal;

adding further variable delays to the received data signal corresponding to the variable delays added to the first clock signal, to generate a further received data signal with the further variable delays; and controlling the radio frequency path based on the further received data signal.

\* \* \* \* \*